United States Patent
Karda et al.

(10) Patent No.: US 12,166,072 B2
(45) Date of Patent: *Dec. 10, 2024

(54) CHANNEL CONDUCTION IN SEMICONDUCTOR DEVICES

(71) Applicant: Lodestar Licensing Group LLC, Evanston, IL (US)

(72) Inventors: Kamal M. Karda, Boise, ID (US); Haitao Liu, Boise, ID (US); Si-Woo Lee, Boise, ID (US); Fatma Arzum Simsek-Ege, Boise, ID (US); Deepak Chandra Pandey, Almora (IN); Chandra V. Mouli, Boise, ID (US); John A. Smythe, III, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/369,512

(22) Filed: Sep. 18, 2023

(65) Prior Publication Data

US 2024/0006478 A1    Jan. 4, 2024

Related U.S. Application Data

(63) Continuation of application No. 17/499,410, filed on Oct. 12, 2021, now Pat. No. 11,769,795, which is a continuation of application No. 16/509,093, filed on Jul. 11, 2019, now Pat. No. 11,171,206.

(51) Int. Cl.
*H01L 29/06*    (2006.01)
*H01L 21/762*    (2006.01)
*H10B 12/00*    (2023.01)

(52) U.S. Cl.
CPC .... *H01L 29/0653* (2013.01); *H01L 21/76224* (2013.01); *H10B 12/053* (2023.02); *H10B 12/31* (2023.02); *H10B 12/34* (2023.02)

(58) Field of Classification Search
CPC .......... H01L 29/0653; H01L 21/76224; H10B 12/053; H10B 12/31; H10B 12/34
See application file for complete search history.

(56) References Cited

U.S. PATENT DOCUMENTS

| | | | |
|---|---|---|---|
| 6,165,869 A | 12/2000 | Qian | |
| 7,332,408 B2 | 2/2008 | Violette | |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 9,899,372 B1 | 2/2018 | Bi | |
| 9,935,104 B1 | 4/2018 | Wang | |
| 10,475,709 B1 | 11/2019 | Chuang | |
| 11,769,795 B2 * | 9/2023 | Karda | H10B 12/31 257/401 |
| 2005/0194597 A1 | 9/2005 | Seo | |

(Continued)

*Primary Examiner* — Nathan W Ha
(74) *Attorney, Agent, or Firm* — Brooks, Cameron & Huebsch, PLLC

(57) ABSTRACT

An example apparatus includes a first source/drain region and a second source/drain region formed in a substrate to form an active area of the apparatus. The first source/drain region and the second source/drain region are separated by a channel. The apparatus includes a gate opposing the channel. A sense line is coupled to the first source/drain region and a storage node is coupled to the second source/drain region. An isolation trench is adjacent to the active area. The trench includes a dielectric material with a conductive bias opposing the conductive bias of the channel in the active area.

20 Claims, 11 Drawing Sheets

(56) References Cited

U.S. PATENT DOCUMENTS

| | | |
|---|---|---|
| 2007/0018273 A1 | 1/2007 | Miller |
| 2008/0164520 A1 | 7/2008 | Darwish |
| 2008/0283929 A1 | 11/2008 | Nabatame |
| 2009/0170321 A1 | 7/2009 | Cho |
| 2010/0047994 A1 | 2/2010 | Dong |
| 2010/0295131 A1 | 11/2010 | Eda |
| 2010/0320542 A1 | 12/2010 | Kawamura |
| 2012/0139080 A1 | 6/2012 | Wang |
| 2012/0211813 A1 | 8/2012 | Taketani |
| 2013/0082393 A1 | 4/2013 | Kawamura |
| 2015/0097231 A1 | 4/2015 | Mathur et al. |
| 2016/0086840 A1 | 3/2016 | Chen |
| 2016/0163858 A1 | 6/2016 | Kim |
| 2017/0179288 A1 | 6/2017 | Cheng |
| 2017/0287922 A1 | 10/2017 | Li |
| 2018/0040481 A1 | 2/2018 | Huang |
| 2019/0006360 A1 | 1/2019 | Tung |
| 2019/0067124 A1 | 2/2019 | Tsai |
| 2019/0103471 A1 | 4/2019 | Aghoram |
| 2019/0131453 A1 | 5/2019 | Lin |
| 2019/0148520 A1 | 5/2019 | Chang |
| 2019/0164846 A1 | 5/2019 | Leib |
| 2019/0206720 A1 | 7/2019 | Verma |
| 2019/0386099 A1 | 12/2019 | Kim et al. |
| 2020/0027870 A1 | 1/2020 | Ha et al. |
| 2020/0035541 A1 | 1/2020 | Chun |
| 2020/0043929 A1 | 2/2020 | Hwang |
| 2020/0091276 A1 | 3/2020 | Cheng |
| 2020/0135863 A1 | 4/2020 | Han |
| 2020/0161171 A1 | 5/2020 | Colombeau |
| 2020/0203523 A1 | 6/2020 | Wu |
| 2020/0227323 A1 | 7/2020 | Zang |
| 2020/0273756 A1 | 8/2020 | Cheng |
| 2020/0295031 A1 | 9/2020 | Lue |
| 2020/0312845 A1 | 10/2020 | Yoon |
| 2020/0312849 A1 | 10/2020 | Cheng |
| 2020/0328080 A1 | 10/2020 | Tapias |

\* cited by examiner

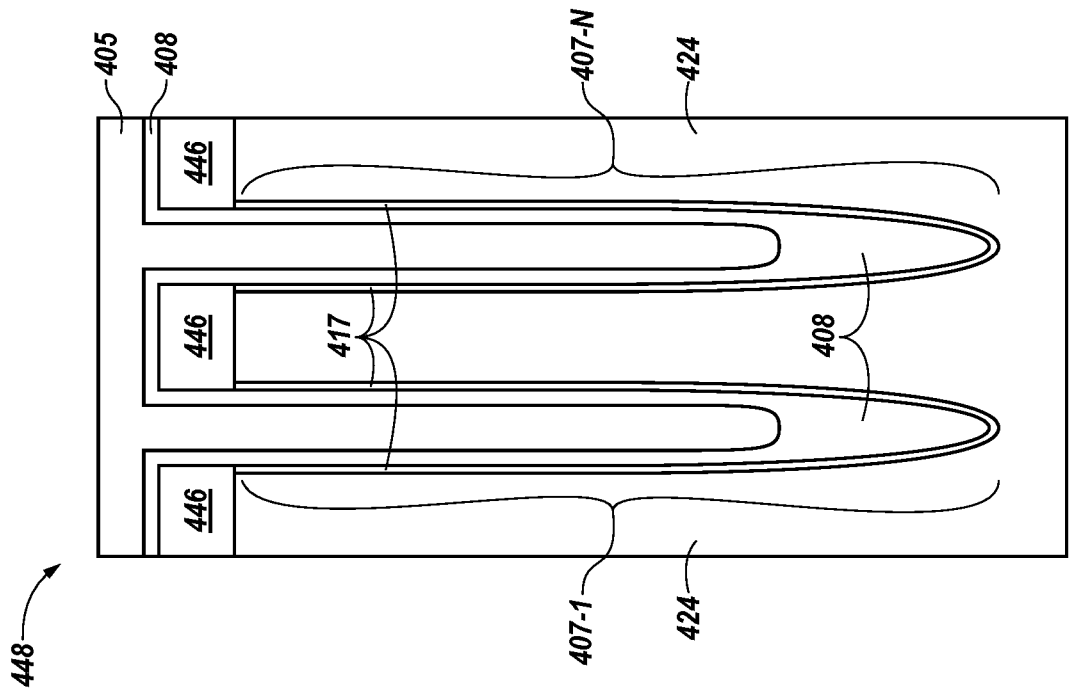
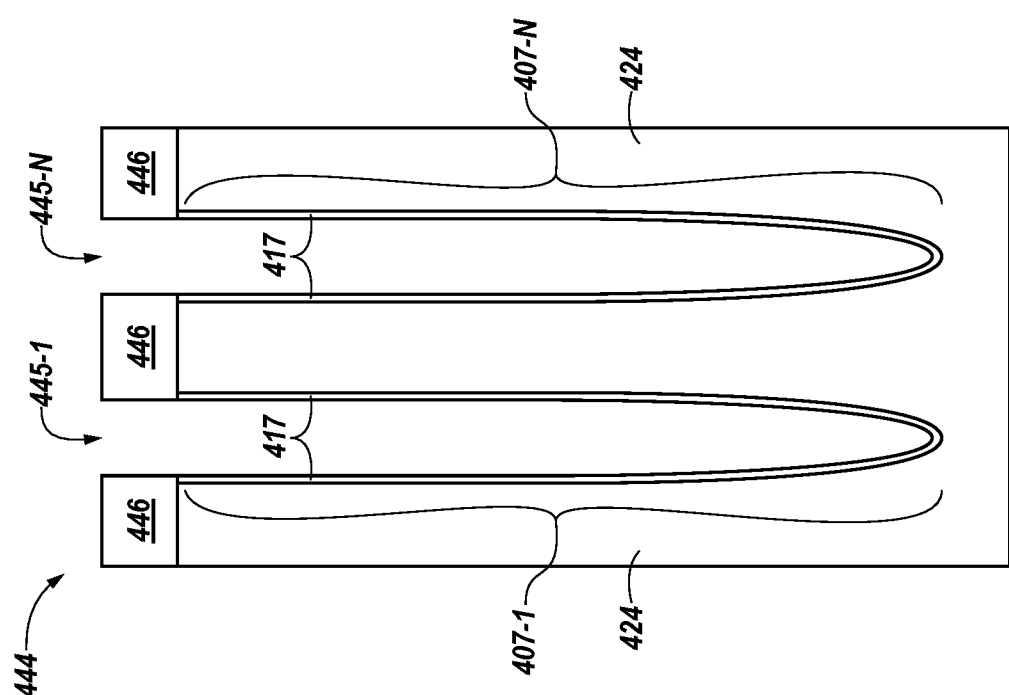

CHANNEL CONDUCTION IN SEMICONDUCTOR DEVICES

PRIORITY INFORMATION

This application is a Continuation of U.S. application Ser. No. 17/499,410 filed on Oct. 12, 2021, which is a Divisional of U.S. application Ser. No. 16/509,093, filed on Jul. 11, 2019, which issued as U.S. Pat. No. 11,171,206 on Nov. 9, 2021, the contents of which are incorporated herein by reference.

TECHNICAL FIELD

The present disclosure relates generally to semiconductor devices and methods, and more particularly to channel conduction in semiconductor devices.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 4A-4D illustrate example cross-sectional views of isolation trenches at particular points in an example semiconductor fabrication process in accordance with a number of embodiments of the present disclosure.

DETAILED DESCRIPTION

Figure 1:
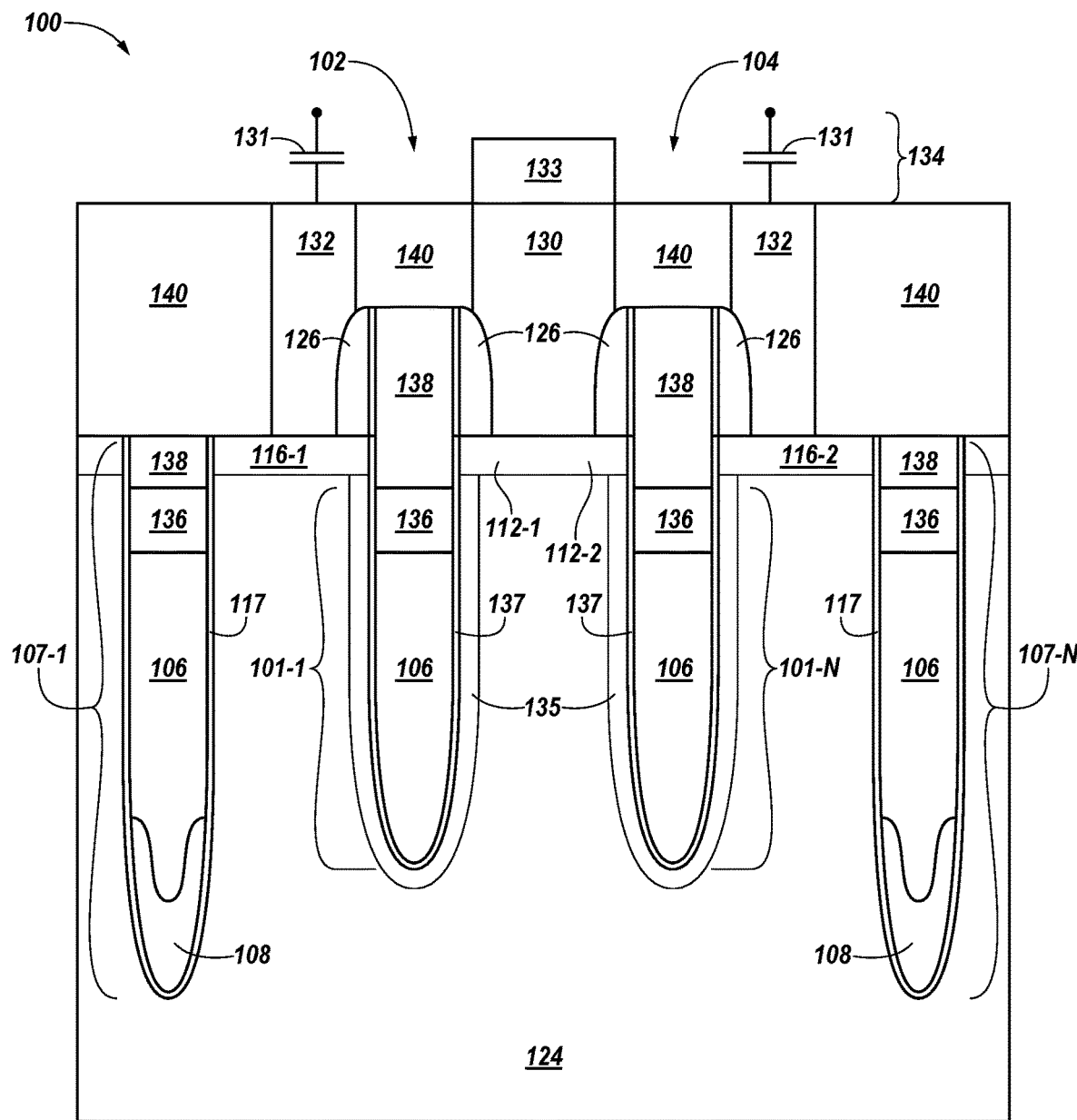
FIG. 1 illustrates an example cross-sectional view of a portion of a semiconductor device in accordance with a number of embodiments of the present disclosure.

The physical size of memory devices is getting smaller. Memory devices may include memory cells including a transistor and a storage element, e.g., a 1T1C (one transistor one capacitor) memory cell. The memory cells may be on pitch with other components of a memory devices such as sensing circuitry (e.g., sense amplifiers) and sub word line drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). The halo margin may be worsened and there may be a threshold voltage (Vt) mismatch between adjacent transistors. Increasing the space between adjacent transistors may reduce the probability of SCE but it may also limit the minimum pitch of other components of the memory device. Turning on and off transistors to shrinking devices and accurately detecting a stored charge during a read operation becomes more and more difficult.

Semiconductors may be doped to influence their conductivity. Adding impurities to a semiconductor material is known as doping. Doping a semiconductor changes the electrical characteristics of the semiconductor and affects the manner in which it conducts electricity. Doped semiconductors may become n-type semiconductors or p-type semiconductors depending on a dopant type. In n-type semiconductors, negatively charged electrons are the majority carriers and positively charged holes are the minority carriers. In p-type semiconductors, positively charged holes are the majority carriers and negatively charged electrons are the minority carriers. Semiconductors may be doped using diffusion or ion implementation.

In some approaches a buried recessed access device (BRAD) may be used to accommodate shrinking size. A BRAD may use doping to improve channel conductivity. Scaling BRADs for future generations has become increasingly challenging due to coupled tradeoff, between gate induced drain leakage (GIDL) and subthreshold leakage. Boron implants to a channel region of a BRAD have mixed results. Methods to achieve desired threshold voltage through boron implants come with a tradeoff of higher GIDL due to higher junction electric field implant damage. The ion implant dopants may migrate within the channel as well, thus changing the device's conductive properties. Achieving uniform channel dopant concentration in increasingly shrinking silicon devices by doping the silicon active area and activating these dopants has become more challenging with scaling.

The present disclosure includes apparatuses and methods related to channel conduction in semiconductor devices. In contrast to some previous approaches, rather than increasing or adding dopant to a channel of the device, a threshold voltage (Vt) of a device may be independently controlled electrostatically through an adjacent isolation trench. An example of an apparatus described herein includes, in a number of embodiments, a first source/drain region and a second source/drain region separated by a channel region. A gate opposes the channel region. A sense line is coupled to the first source/drain region and a storage node is coupled to the second source/drain region. An isolation trench, adjacent to an active area of the device includes a material with a conductive bias opposing a conductive bias of a channel in the active area.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of memory devices may refer to one or more memory devices and a number of iterations of particular elements recited in a claim may refer to performing the particular elements in one or more cycles.

The figures herein follow a numbering convention in which the first digit or digits correspond to the figure number of the drawing and the remaining digits identify an element or component in the drawing. Similar elements or components between different figures may be identified by the use of similar digits. For example, 217 may reference element "17" in FIG. 2, and a similar element may be referenced as 317 in FIG. 3.

Figure 8:
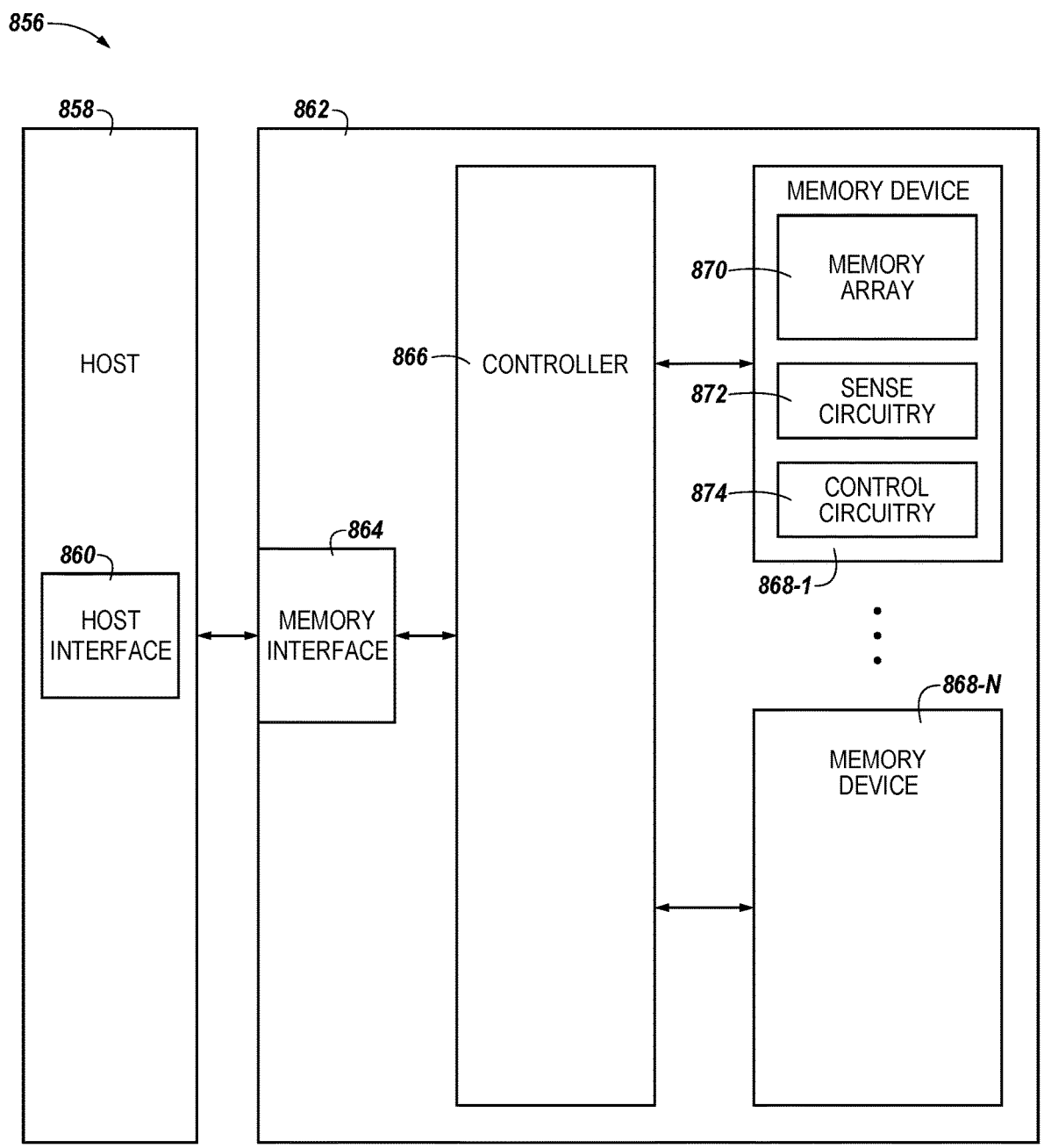
FIG. 8 is a functional block diagram of a computing system including at least one memory array having transistors formed in accordance with a number of embodiments of the present disclosure.

FIG. 1 illustrates an example cross-sectional view of a portion of a semiconductor device in accordance with a number of embodiments of the present disclosure. FIG. 1 illustrates neighboring access devices 102 and 104, e.g., memory cell transistors, as may be present in a memory array of a memory device such as shown in FIG. 8. In the example embodiment of FIG. 1, the neighboring access devices 102 and 104 are shown as buried recessed access devices (BRADs). Embodiments, however, are not limited to this example. Isolation trenches 107-1, . . . , 107-N (collectively or individually referred to as isolation trench 107) may be used to separate neighboring access devices from other access devices according to a particular array layout. FIG. 1 illustrates a pair of isolation trenches 107 in one such architecture in accordance with an embodiment of the present disclosure. In semiconductor device 100, an isolation trench 107 may be used to prevent electric current leakage between adjacent semiconductor device components. Isolation trench 107 may be formed by etching a pattern of the isolation trench 107 into a substrate material 124 and depositing dielectric materials, e.g., 117 and 108, into the trench 107. In a semiconductor fabrication process, other trenches may be formed and a gate dielectric 137 and semiconductor materials may be deposited to form access device gates 106 and 136 (collectively or individually referred to as gate 106) according to a particular BRAD design process. Gate 106 may also be referred to as a passing access line. Embodiments are not limited to the example shown. In this example of neighboring BRAD devices 102 and 104, isolation trench 107 may be formed to a greater depth than a depth of a gate area 101-1, . . . , 101-N of the BRAD devices 102 and 104. The isolation trench 107 may have an aspect ratio in a range of 15:1 to 20:1.

In one embodiment, a first dielectric 117 may be deposited into the isolation trench 107. The first dielectric 117 may be deposited to a thickness in a range of 1-5 nanometers (nm). The first dielectric 117 can be an initial barrier between the substrate material 124 and the other neighboring semiconductor devices and/or components. In one example embodiment, a dielectric material 108 may be deposited into the isolation trench 107. The dielectric material 108 may have a conductive bias that opposes the conductive bias of a channel region 135 of an active area for the respective BRAD devices 102 and 104. In some embodiments, the dielectric material 108 with a conductive bias opposing the conductive bias of an active area may be aluminum oxide (AlOx). Depositing the dielectric material 108 into the isolation trench 107 may allow a threshold voltage (Vt) of the BRAD devices 102 and 104 to be independently controlled electrostatically at the bottom of a channel 135.

Depositing the dielectric material 108 may reduce or eliminate an amount of dopant, e.g., Boron, used in a channel 135 to maintain particular conductive properties of the BRAD devices 102 and 104. As previously mentioned, doping a channel 135, may result in diffusion and the dopant spreading to other unintended areas. Diffusion is a process in which dopants introduced into a substrate material spread into other areas. Since in diffusion, a dopant may spread to other areas, the dopant may undesirably change the conductive properties of other materials in a manner that was not intended. Depositing the dielectric material 108 with a fixed charge opposing the doping type of the channel 135 into the isolation trench 107 may reduce the risk associated with doping a channel region 135 of the BRAD devices 102 and 104. In the example of a p-type channel 135 BRAD device 102 and 104, AlOx may be deposited into the isolation trench 107. This solution may also decrease gate induced drain leakage (GIDL) occurrence by reducing or avoiding the use of Boron in the channel 135 and, as a result, decreasing the likelihood of the Boron dopant in a channel region 135 spreading to other areas.

A passing access line, e.g. word line, 106 may also be deposited into the isolation trench 107. In some embodiments, passing access line 106 may be a metal. The passing access line 106 may be deposited over the dielectric material 108 having a conductive bias opposing the conductive bias of the channel 135. In some embodiments, the passing access line 106 may be deposited to fill the remaining portion of the isolation trench 107.

The depth of the isolation trench 107 may be deeper than the depth of a trench 101-1, . . . , 101-N used to form an active of the access line (e.g. a word line (gate)) 106 and 136. The isolation trench 107 may have a depth in the range of 200-250 nm. The dielectric material 108 with a conductive bias opposing the conductive bias of an active area may be deposited to height that is above a portion of a bottom surface of the neighboring gate 106 to access devices 102 and 104. For example, the dielectric material 108 may be deposited to height that is ten percent (10%) to twenty percent (20%) of the depth of a gate 106 starting from the bottom of the gate 106. However, embodiments are not so limited and other ranges may be used for particular applications or design rules.

As shown in FIG. 1, the gates 106 are also formed for the access devices 102 and 104. As shown, the gate 106 may be a gate to a recessed access device, e.g., a buried recessed access device (BRAD). In the example shown, the gate 106 may include a gate material 106 including a metal, e.g., titanium nitride (TiN), and a gate material 136 including a doped polysilicon to form a hybrid metal gate (HMG). The gate 106 may be separated from a channel 135, separating a first source/drain region 116-1 and 116-2 (collectively or individually referred to as first source/drain region 116) and a second source/drain region 112-1 and 112-2 (collectively or individually referred to as second source/drain region 112) by a gate dielectric 137.

In the example of FIG. 1, two neighboring access devices 102 and 104 are shown sharing a second source/drain region 112 at a junction. The sense line contact 130 may be formed of a metallic material, or other conductive contact. A sense line contact 130 may be formed in contact with the second source/drain region 112, and the junction. A sense line 133, e.g. digit line or bit line may be formed in contact with the sense line contact 130. A storage node contact 132 may be coupled to each first source/drain region 116, and a storage node 131 may be coupled to the storage node contact 132. An insulation material 140 (e.g., a dielectric material) may be formed on spacer material and mask material 126 and 138, to separate conductive contacts 132.

In at least one embodiment, a portion of the sense line contact 130 may be formed in contact with spacer material 126, the second source/drain regions 112, and the junction. Insulation material 140 may be formed on the spacer material 126, the mask material 138, and in contact with a portion of the sense line contact 130 and storage node contacts 132. A gate dielectric 137 separates the gate 106 from the channel 135 for each of the neighboring BRAD devices 102 and 104 shown in the example of FIG. 1.

Figure 2:
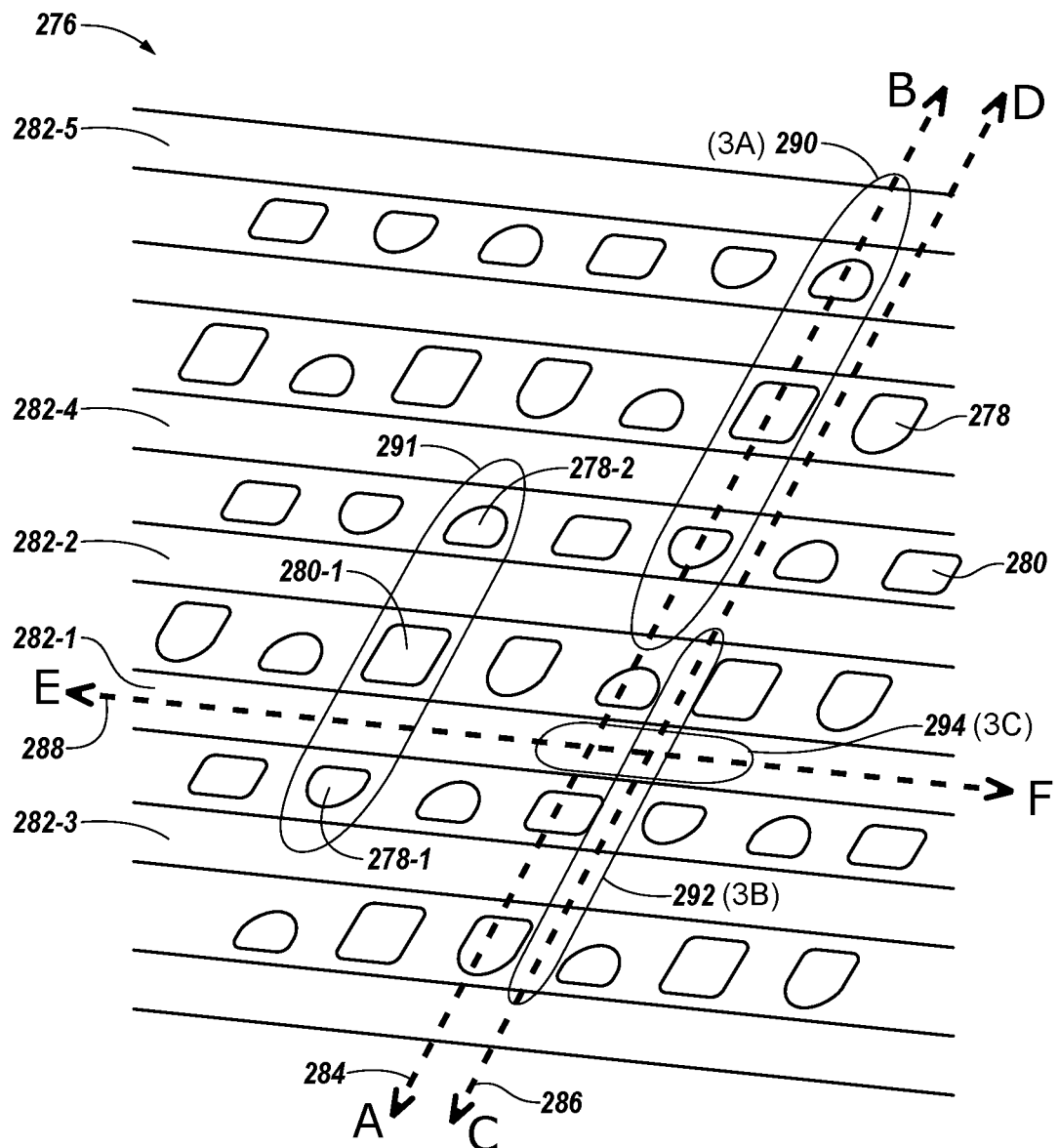
FIG. 2 illustrates an example top-down view of a memory array structure in accordance with a number of embodiments of the present disclosure.

FIG. 2 illustrates an example of a top-down view of a memory array structure 276 in accordance with a number of embodiments of the present disclosure. FIG. 2 illustrates a number of active area regions, e.g. 291 and 290, first source/drain regions 278, and second source/drain regions 280. Area 291 encompasses a pair of access devices sharing a second source/drain region 280-1 that can be connected to a sense line and a pair of first source/drain regions 278-1 and 278-2. The second source/drain region 280-1 and the first source/drain region 278-1 can be separated by a channel and an access line 282-1. Adjacent the example active areas 291 and 290 on either side can be located a number of passing access lines 282-3 and 282-4 to other active areas.

Figure 3A:
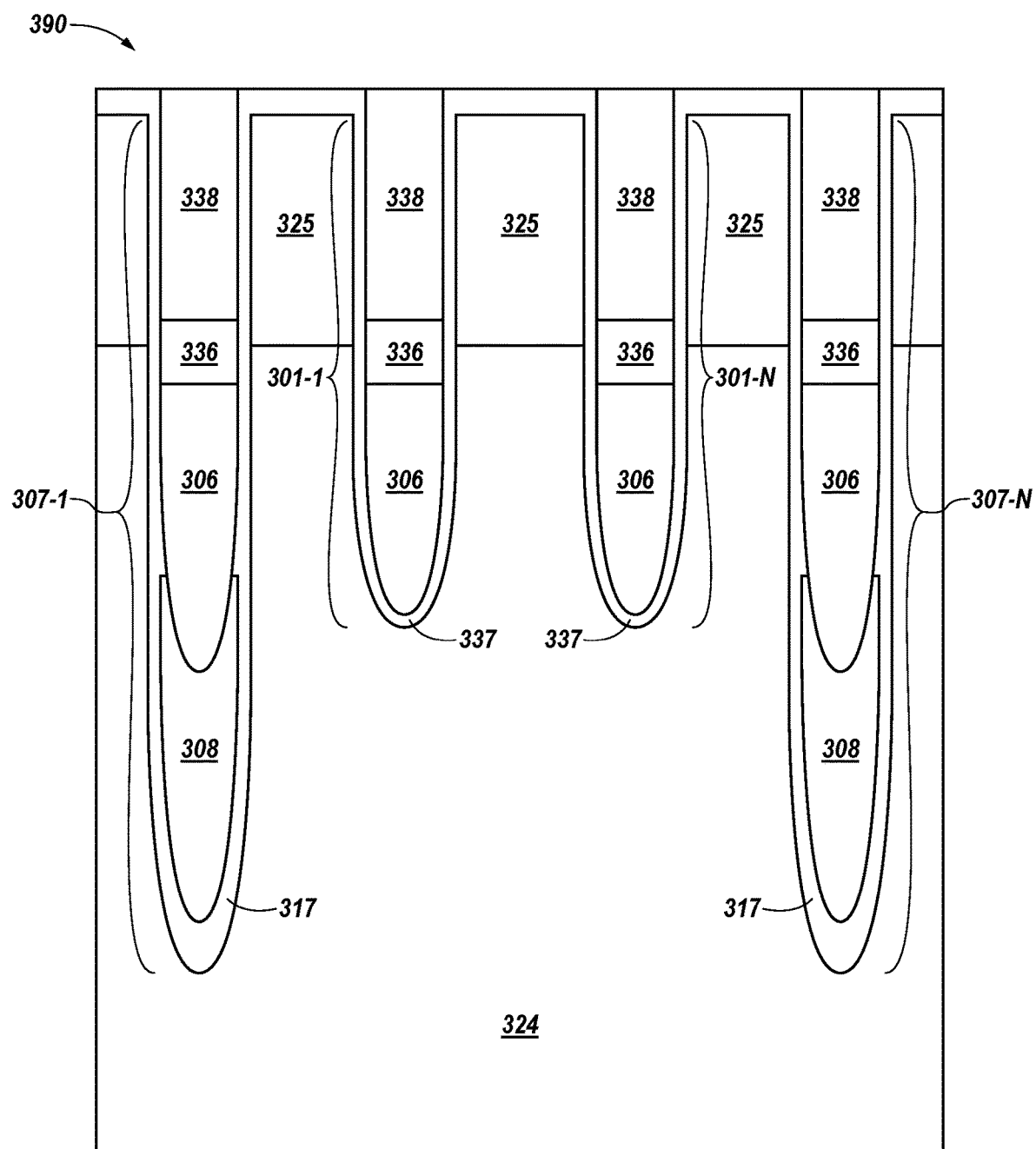
FIGS. 3A-3C illustrates example cross-sectional views of a memory array structure at different locations within the substrate in a semiconductor fabrication sequence in accordance with a number of embodiments.

In the example of FIG. 2, area 290 encompasses an active area of neighboring access devices and neighboring, passing access lines 282-2 and 282-5. A cross-sectional view taken along cut line A-B 284 is shown in FIG. 3A. The passing access lines 282-2 and 282-5 in Area 290, may be formed in isolation trenches, e.g. isolation trench 107 in FIG. 1. The trenches may include aluminum oxide with a conductive bias opposite the conductive bias of an adjacent channel, e.g. channel 135 in FIG. 1. The aluminum oxide may be used to electrostatically control a threshold voltage of the channel.

Area 291 illustrates a pair of access devices sharing a source/drain region. Semiconductor structures formed according to the top-down view of an example memory array layout may include access devices, e.g., transistors, and storage nodes, e.g., capacitor cells, etc. A dynamic random access memory (DRAM) array is one form of example memory array that can be formed from semiconductor structures fabricated through a semiconductor fabrication process performed on a substrate of a semiconductor wafer. A memory array may have an of array of access devices and storage nodes forming memory cells at the intersection of rows and columns.

Figure 3B:
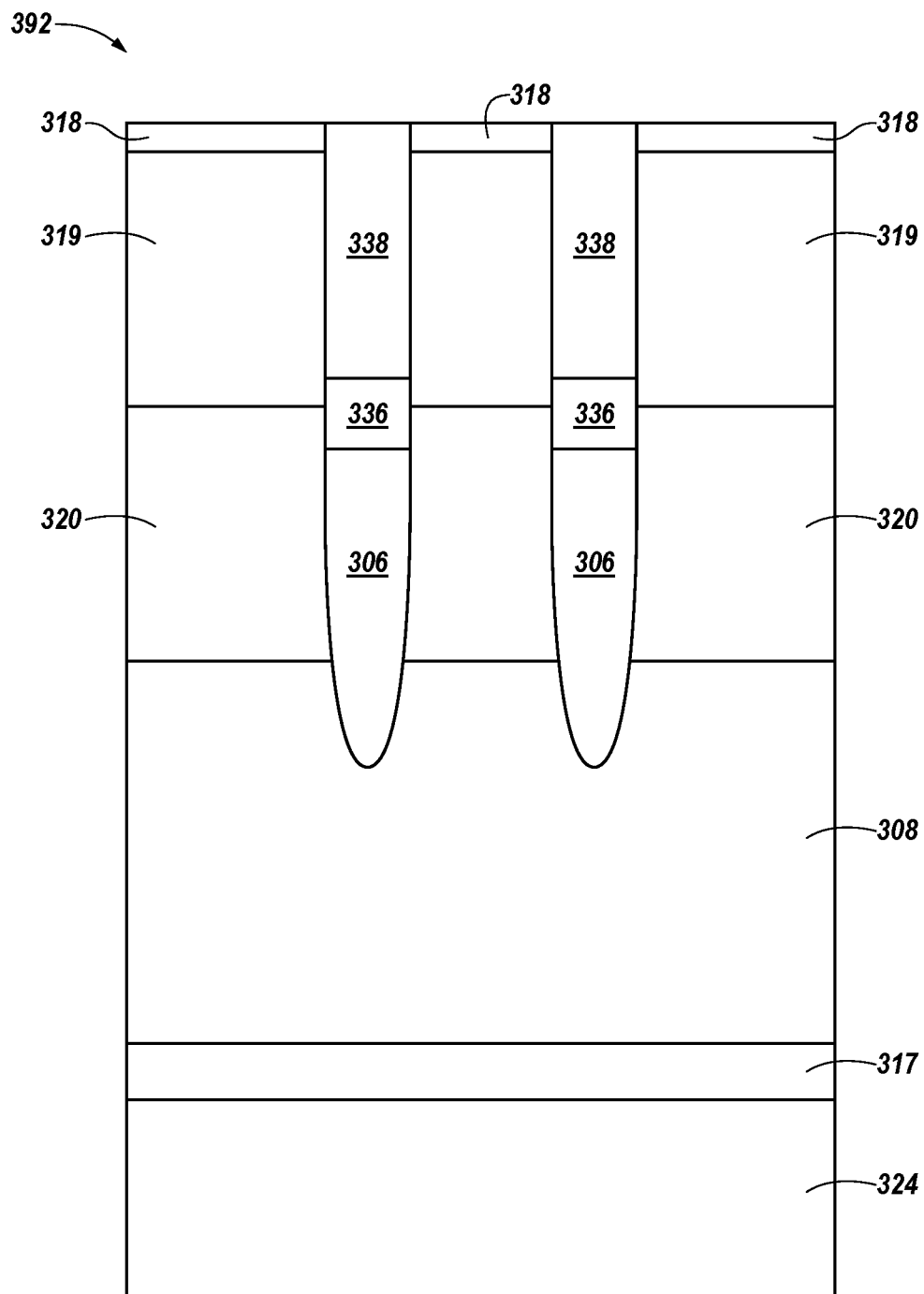

Area 292 illustrates an isolation area between columns of sense lines to access devices taken along cut line C-D 286. A cross section along cut-line C-D 286 is shown in FIG. 3B. The isolation area may be formed by depositing a dielectric material between adjacent active area regions, e.g. 291 and 290. The dielectric material in the isolation area may decrease the likelihood of semiconductor structures formed adjacent the active area region 291 and 290 communicating, e.g. disturbing one another, in a manner that is not intended. Area 292 may also encompass portions of passing access lines 282-2.

Figure 3C:
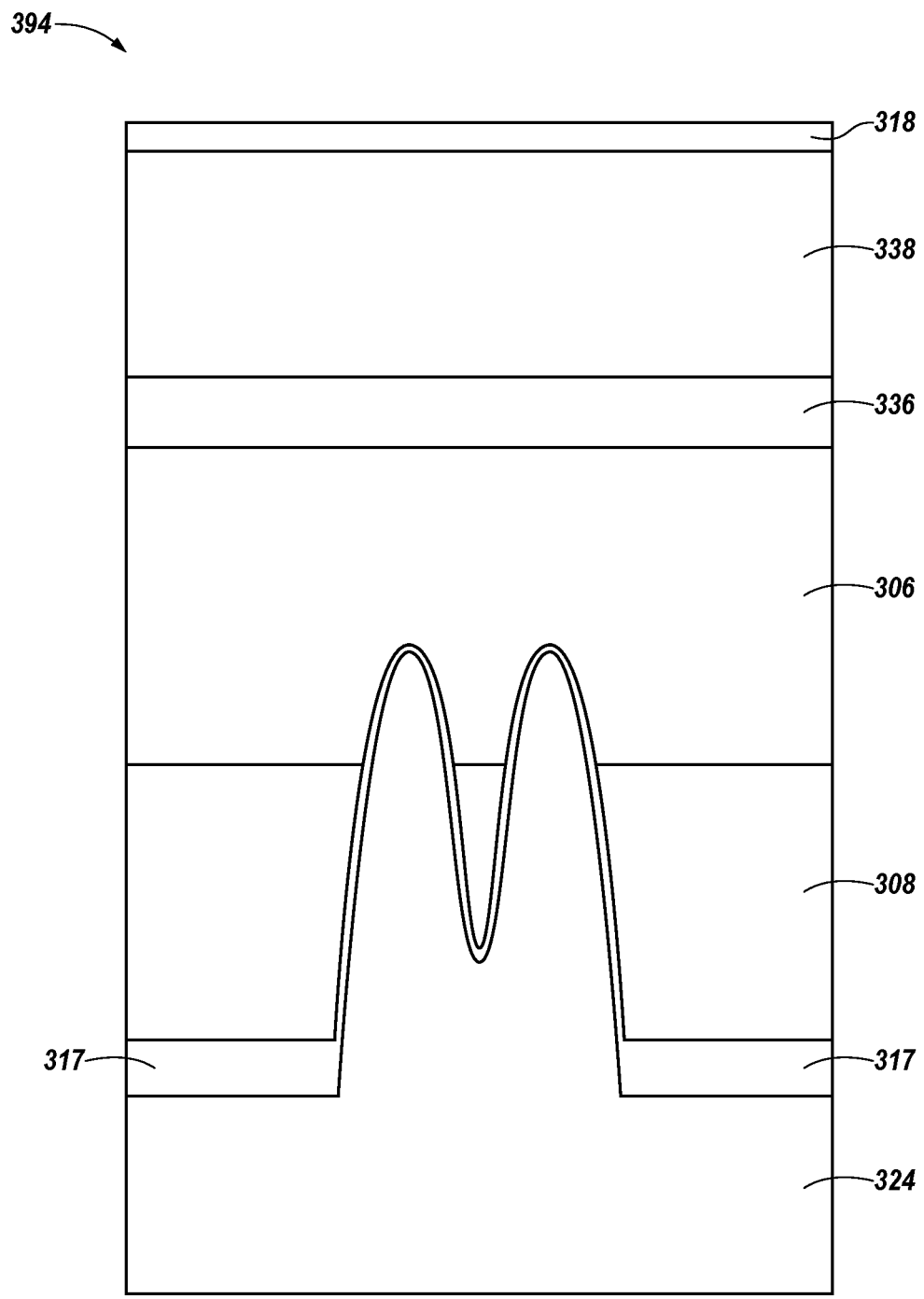

Area 294 illustrates a portion of an access line 282-1 along cut-line E-F 288. A cross section along cut-line E-F 288 is shown in FIG. 3C. The access line 282-1 may serve as a gate to adjacent to active areas. An access line, e.g., word line (WL), may be used to activate an access device, e.g., access transistor, to access, e.g., turn "on" or "off" access, to the storage node, e.g., capacitor cell, of a memory cell. A sense line, e.g., bit line (BL) may be used to read and/or program, e.g., write, refresh, erase, etc., to and/or from a storage node of the memory cells.

FIGS. 3A-3C illustrates example cross-sectional views of a memory array structure at different locations within the substrate in a semiconductor fabrication sequence in accordance with a number of embodiments. The cross-sectional views of FIGS. 3A-3C correspond to cut lines A-B, C-D, and E-F shown in FIG. 2.

FIG. 3A illustrates a cross-sectional view of the memory array structure taken along cut-line A-B, and encompassed by active area region 290 as shown in FIG. 2 at particular point in time 390 in a semiconductor fabrication process. FIG. 3A illustrates isolation trenches 307-1, ..., 307-N, collectively or individually referred to as isolation trench 307, and gates 336 and 306, collectively or individually referred to as gate 306, formed to a depth of 301-1, ..., 301-N into a working surface of a substrate material 324. FIG. 3A also illustrates a gate dielectric 337 deposited in the gate 306.

Isolation trench 307 may include a first dielectric material 317, a second dielectric material 308, passing access line conductive materials 306 and 336, an insulator fill 338. In various embodiments, the second dielectric material 308 is a high dielectric constant (k), for example, aluminum oxide (AlOx). However, embodiments are not so limited and the dielectric may have a k from 1-50.

FIG. 3B illustrates a cross-sectional view of the memory array structure taken along cut-line C-D, and encompassed by active area region 292 as shown in FIG. 2 at a particular point in time 392 in a semiconductor fabrication process. FIG. 3B illustrates isolation trenches 307. Isolation trench 307 may include a first dielectric material 317, second dielectric material 308, passing access line conductive material 306 and 336, and an insulator fill material 338. FIG. 3B may also include a substrate 324 and dielectric materials 318, 319, 320.

FIG. 3C illustrates a cross-sectional view of the memory array structure, taken along cut-line E-F, and encompassed by active area 294 as shown in FIG. 2 at a particular point in time 394 in a semiconductor fabrication process. FIG. 3C illustrates a substrate material 324, dielectric materials 308 and 317, passing access line conductive material 306 and 336, and a mask material 338.

FIGS. 4A-4D illustrate example cross-sectional views of isolation trenches at particular points in an example semiconductor fabrication process in accordance with a number of embodiments of the present disclosure. The fabrication process illustrated in FIGS. 4A-4D is shown at particular points in time that correspond to particular processing activities being performed in the fabrication process. Other processing activities included in a particular fabrication sequence may be omitted for ease of illustration.

FIG. 4A illustrates forming an opening 445-1, ..., 445-N (collectively or individually referred to as opening 445) in a working surface in a semiconductor fabrication process wherein the working surface of a semiconductor substrate 424 is patterned at a point in time 444. In one embodiment, a location for the opening 445 is patterned to form an isolation trench 407-1, . . . , 407-N (collectively or individually referred to as isolation trench 407). The working surface is etched to form the opening 445. The etching may be performed according to a reactive ion etch (RIE) process, or other suitable etching technique. As shown in FIG. 4A, the first dielectric 417 may be deposited in an opening 445. In some embodiments, the first dielectric is an oxide deposited using a conformal deposition technique such as a chemical vapor deposition (CVD) technique in a semiconductor processing apparatus. As shown in FIG. 4A, a hard mask material 446 may be used to pattern the opening formed in the substrate material 424.

In one embodiment, the working surface of the semiconductor substrate material 424 may be patterned using a photolithography technique. The mask material is a photosensitive material and portions of the mask material that were patterned are hardened to form the trench boundaries.

As shown in the embodiment of FIG. 4A, a first dielectric 417 may be deposited in the opening 445. As noted, the first dielectric 417 may be an oxide. In some embodiments, the first dielectric 417 may be formed from a low dielectric constant (k) material. The first dielectric 417 may be conformally deposited in the isolation trench 407. In some embodiments, the first dielectric 417 is deposited to a thickness in a range of 1 nanometer (nm) to 5 nm. In some embodiments, the first dielectric 417 may be deposited to a thickness of 3 nm.

FIG. 4B illustrates a semiconductor structure during a semiconductor process at another point in time 448 in the fabrication process. A dielectric material 408 is deposited on the conformally deposited first dielectric 417. According to embodiments, the second dielectric material 408 is selected to have a conductive bias opposing the conductive bias of a channel to within the isolation trench 407-1, . . . , 407-N (collectively or individually referred to as isolation trench 407) at point in time 448. In an example embodiment, a channel is a p-type channel to n-type access device and the second dielectric material 408 is selected as aluminum oxide (AlOx). The second dielectric material 408 may be deposited using a conformal deposition. The second dielectric material 408 may be continuously deposited to a height in a range of 10 angstroms (A) to 30 A from the bottom of the isolation trench 407. In some embodiments, the dielectric material 408 may be continuously deposited to a height of 20 A.

FIG. 4B further illustrates depositing a hard mask 446 over a substrate 424. The material 408 may be conformally deposited in the isolation trench 407 and over hard mask 446. A dielectric material 405 may be deposited into the isolation trench 407. The dielectric material 405 may be deposited over the material 408. According to embodiments, the third dielectric material 405 may be a sacrificial dielectric material. The dielectric material 405 may, for example, be formed out of an oxide, a polymer, or a carbon based material.

Figure 4C:
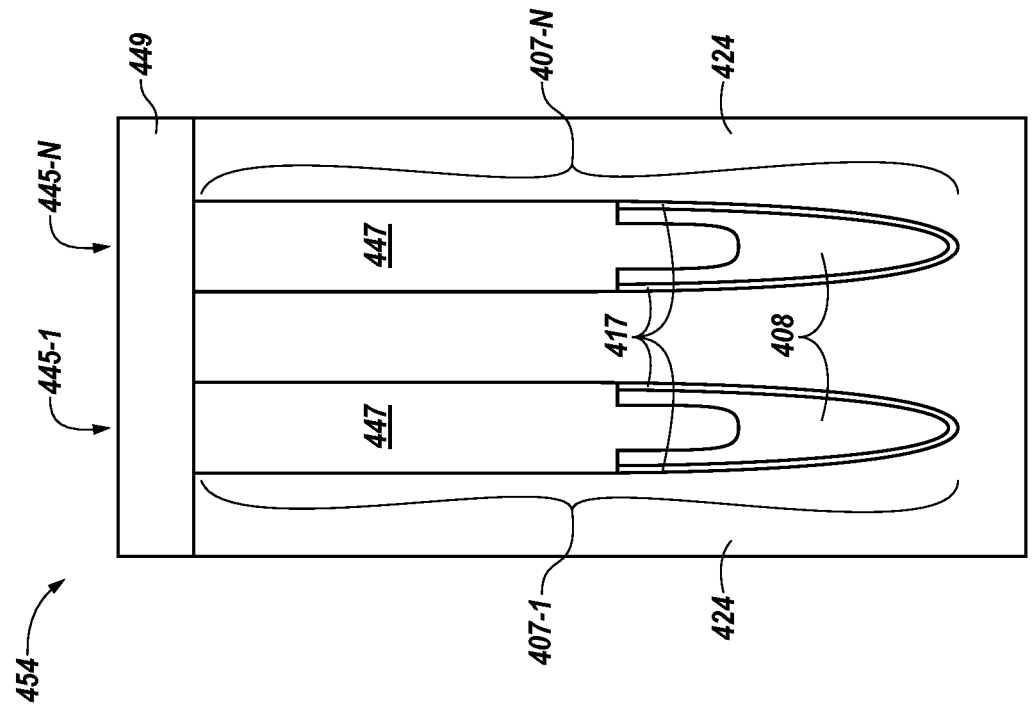

FIG. 4C illustrates etching the third dielectric material 405 at a point in time 452. According to embodiments, a selective dry etch may be performed to remove a portion of the sacrificial, third dielectric material 405 and recess the third dielectric material 405 within the opening 445 and trench 407.

In some embodiments, the dry etch may have a selectivity to the second dielectric material 408, e.g., AlOx, of 30:1.

According to embodiments, a hydrofluoric (HF) wet etch is performed selective to the second dielectric material 408, e.g., AlOx.

Figure 4D:
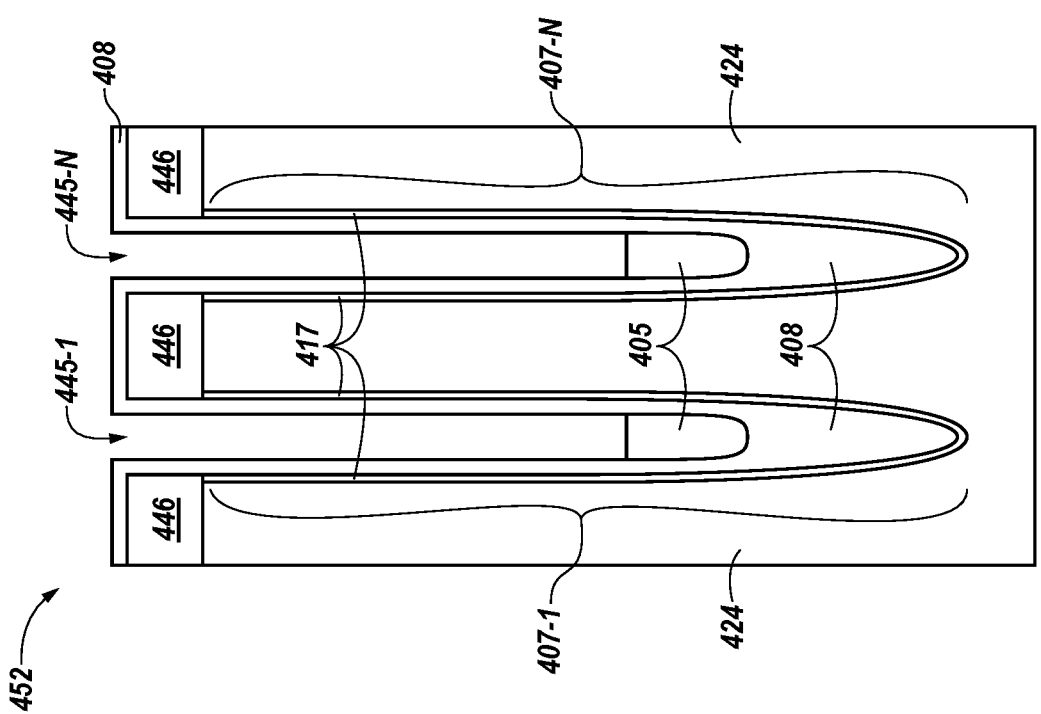

FIG. 4D illustrates a process flow at a subsequent point in time 454. In the example of FIG. 4D, a subsequent etch process has been performed. The embodiment of FIG. 4D further illustrates etching a portion of the second dielectric material 408, e.g., AlOx, to remove portions of the second dielectric material 408, e.g., AlOx, from sidewalls of the trench 407. In some embodiments, the second dielectric material 408 may be etched down to a height in a range of 10 A to 30 A from the bottom of the isolation trench 407. The embodiment of FIG. 4D further illustrates a fourth dielectric material 447 may be deposited to fill trenches 445. The fourth dielectric material 447 may be an oxide or nitride. This may be followed by another nitride deposition layer 449 and planarized, e.g., using chemical mechanical planarization (CMP).

Figure 5:
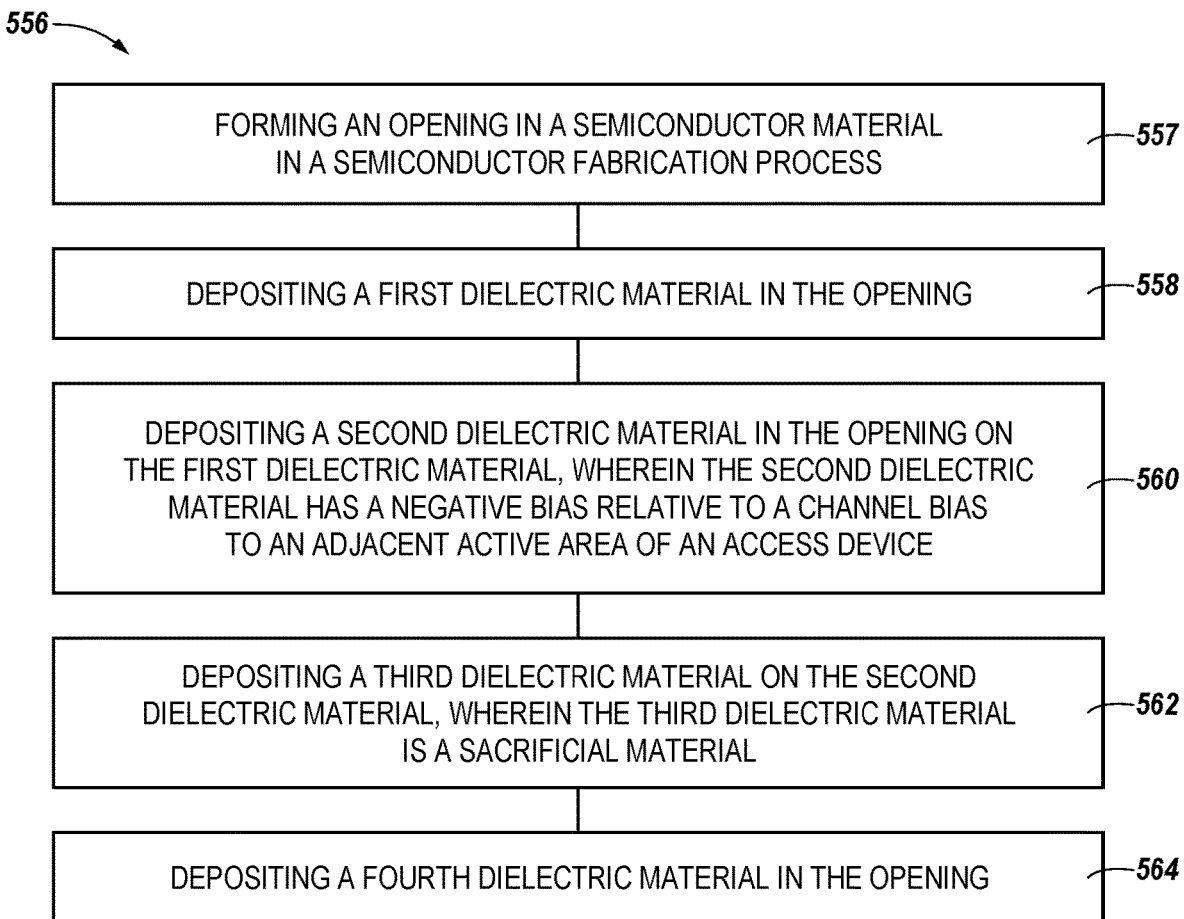
FIGS. 5-6 are flow diagrams of example methods for fabricating isolation trenches in accordance with a number of embodiments of the present disclosure.

FIG. 5 is a flow diagram of example methods for fabricating isolation trenches in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 557, the method 556 may include forming an isolation trench by forming an opening in a semiconductor material in a semiconductor fabrication process. The isolation trench may be etched into a substrate material. The isolation trench may be etched down to a depth in a range of 200 nm to 250 nm. In some embodiments, the isolation trench may be etched down to a depth of 240 nm.

At block 558, the method 556 may include forming an isolation trench by depositing a first dielectric material in the opening of a substrate material. In some embodiments, the first dielectric material may be an oxide. The dielectric material may be conformally deposited. The first dielectric material may be deposited to a thickness in a range of 1 nm to 5 nm. In some embodiments, the first dielectric material may be deposited to a thickness of 3 nm.

At block 560, the method 556 may include forming an isolation trench by depositing a second dielectric material on the first dielectric material. According to embodiments, the second dielectric material may be deposited having a negative bias relative to a channel bias to an adjacent active area of an access device. The material may be deposited over a dielectric material using chemical vapor deposition. In some embodiments, the second dielectric may be deposited to partially fill the trench. The second dielectric may be deposited to a thickness in a range of 1-5 nm. In some embodiments, the second dielectric material can be AlOx. The second dielectric material may be used to electrostatically control the threshold voltage of an adjacent channel.

At block 562, the method 556 may include forming an isolation trench by depositing a third dielectric material on the second dielectric material having a negative bias relative to a channel. In some embodiments, the third dielectric is material is a sacrificial material. In some embodiments, the third dielectric material may be an oxide or a nitride. In some embodiments, the third dielectric material may be formed form a different material than the first dielectric material.

At block 564, the method 556 may include forming an isolation trench by depositing a fourth dielectric material in the opening. According to various embodiments, a fourth dielectric may be deposited to fill the trench. In some embodiments, the fourth dielectric may be an oxide or a nitride. However, embodiments are not so limited and the fourth dielectric may be formed from other materials.

Figure 6:
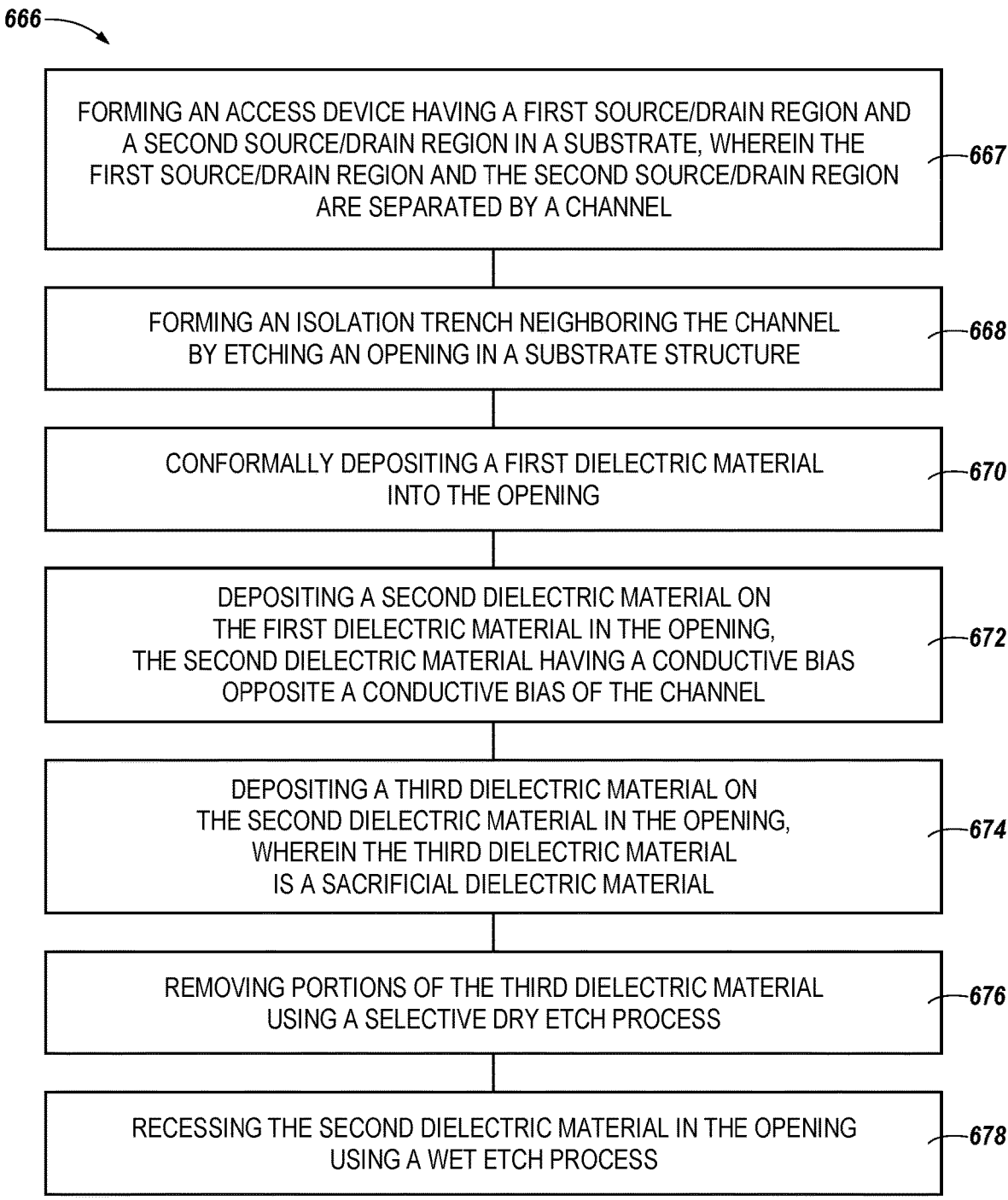

FIG. 6 is a flow diagram of an example method 666 for fabricating isolation trenches in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 667, the method 666 may include forming a first source/drain region and a second source/drain region in a substrate. The first source/drain region and the second source/drain region may be separated by a channel. At block 668, method 666 may include forming an isolation trench neighboring the channel by etching an opening in a substrate structure. Photolithography may be used to pattern the substrate structure and a subsequent etch may be used to form the opening.

At block 670, the method 666 may include forming an isolation trench by conformally depositing a first dielectric material into the opening. The first dielectric material may be used as a diffusion barrier to prevent the diffusion of a material, e.g. a second dielectric material, into the substrate material. In some embodiments, the first dielectric material may be deposited to a thickness in a range of 1 nm to 5 nm.

At block 672, method 666 may include forming an isolation trench by depositing the second dielectric material over the first dielectric material. The second dielectric material may have a conductive bias opposing a conductive bias of the channel. In some embodiments, the second dielectric material may be aluminum oxide. Atomic layer deposition may be used to deposit the aluminum oxide over the first dielectric material. Selectively depositing the aluminum oxide into the isolation trench may adjust a threshold voltage of an adjacent channel.

At block 674, the method 666 may include forming an isolation trench by depositing a third dielectric material over the second dielectric material. The third dielectric material may be a sacrificial dielectric material. The third dielectric material may provide control for recessing the second dielectric material.

At block 676, the method 666 may include removing portions of the third dielectric material from the opening of the isolation trench. This etch may be a selective dry etch process. At block 676, the method 666 may include recessing the second dielectric material in the opening using a wet etch process. The second dielectric material may be recessed to a height that is 10-20% of the height of an adjacent access device measured from the bottom of the access device.

Figure 7:
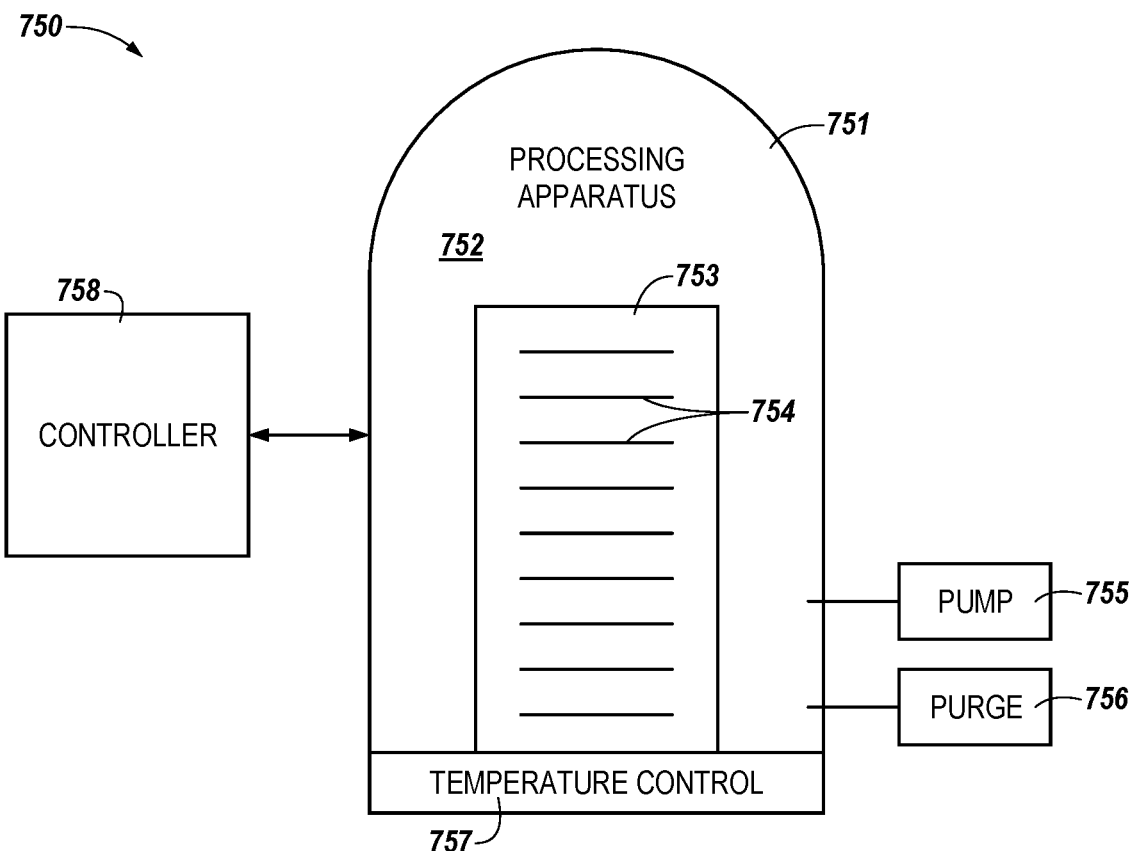
FIG. 7 is a functional block diagram of a system for implementation of an example semiconductor fabrication process in accordance with a number of embodiments of the present disclosure.

FIG. 7 is a functional block diagram of a system 750 for implementation of an example semiconductor fabrication process in accordance with a number of embodiments of the present disclosure. The numbering convention used in connection with FIG. 7 does not follow the earlier introduced numbering convention and sequence that applies to FIGS. 1-6. The system 750 may include a processing apparatus 751. The processing apparatus 751 may be configured to enable formation of structural materials on and/or removal of structural materials from a semiconductor device during fabrication of the semiconductor device.

FIG. 7 illustrates an example processing apparatus 751 that may be used in a semiconductor fabrication process. The processing apparatus 751 may include a chamber 752 to enclose components configured to perform deposition and/or etch operations on a number of semiconductor devices. The chamber 752 may further enclose a carrier 753 to hold a batch of semiconductor wafers 754. The processing apparatus 751 may include and/or be associated with tools including, for example, a pump 755 unit and a purge 756 unit configured to introduce and remove appropriate etch chemistries, as described herein, at each point in the semiconductor fabrication sequence. The processing apparatus 751 may further include a temperature control 757 unit configured to maintain the chamber 752 at an appropriate temperature at each of the points in the fabrication sequence. The system 750 may include a number of chambers 752 that are each configured to perform particular processes (e.g., a wet etch process, a dry etch process, and/or a deposition process, among others) during the fabrication sequence.

The system 750 may further include a controller 758. The controller 758 may include, or be associated with, circuitry and/or programming for implementation of, for instance, forming a dielectric material in a trench to a passing access line. The dielectric material has a bias opposing a conductivity of a channel region to a neighboring access device. Adjustment of such deposition, removal, and etching operations by the controller 758 may control the critical dimensions (CDs) of the semiconductor devices created in the processing apparatus 751.

A host may be configured to generate instructions related to protection of a top region of a pillar and an adjacent trench during removal of a substrate material at a bottom region of a trench of the semiconductor device. An example of a host is shown at 858 in FIG. 8, although embodiments are not limited to being coupled to the memory system 862 shown in FIG. 8. The instructions may be sent via a host interface 860 to the controller 758 of the processing apparatus 751. The instructions may be based at least in part on scaled preferences (e.g., in numerically and/or structurally defined gradients) stored by the host 702, provided via input from another storage system (not shown), and/or provided via input from a user (e.g., a human operator), among other possibilities. The controller 758 may be configured to enable input of the instructions and scaled preferences to define the CDs of the fabrication of the semiconductor device to be implemented by the processing apparatus 751.

The scaled preferences may determine final structures (e.g., the CDs) of the top region of the pillar, a sidewall of the pillar, a width of the pillar, a width of the trench, and/or a depth of the trench. Particular CDs may be enabled by the particular scaled preferences that are input via the instructions. Receipt and implementation of the scaled preferences by the controller 758 may result in corresponding adjustment, by the processing apparatus 751, of a deposition time for the passivation material, adjustment of a coverage area, height, and/or volume of the passivation material, adjustment of a trim direction and/or trim time performed on the passivation material, and/or adjustment of punch etch direction and/or punch etch time performed on the substrate material, among implementation of other possible scaled preferences.

The controller 758 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent a trench, along with formation of passivation material on and removal of the passivation material from the pillar and the trench.

The controller 758 may be configured to receive the instructions and direct performance of operations to perform isolation trench fabrication methods as described in connection with FIGS. 5-6.

FIG. 8 is a functional block diagram of a computing system 856 including at least one memory system 862 in accordance with one or more embodiments of the present disclosure. The numbering convention used in connection with FIG. 8 does not follow the earlier introduced numbering convention and sequence that applies to FIGS. 1-6. Memory system 862 may be, for example, a solid-state drive (SSD).

In the embodiment illustrated in FIG. 8, memory system 862 includes a memory interface 864, a number of memory devices 868-1, . . . , 868-N, and a controller 866 selectably coupled to the memory interface 864 and memory devices 868-1, . . . , 868-N. Memory interface 864 may be used to communicate information between memory system 862 and another device, such as a host 858. Host 858 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 858 may be associated with fabrication operations performed on semiconductor devices and/or SSDs using, for example, a processing apparatus shown at 851 and described in connection with FIG. 8.

In a number of embodiments, host 858 may be associated with (e.g., include or be coupled to) a host interface 860. The host interface 860 may enable input of scaled preferences (e.g., in numerically and/or structurally defined gradients) to define, for example, critical dimensions (CDs) of a final structure or intermediary structures of a memory device (e.g., as shown at 868) and/or an array of memory cells (e.g., as shown at 870) formed thereon to be implemented by the processing apparatus 851. The array includes transistors having an isolation trench formed according to embodiments described herein. The scaled preferences may be provided to the host interface 860 via input of a number of preferences stored by the host 858, input of preferences from another storage system (not shown), and/or input of preferences by a user (e.g., a human operator).

Memory interface 864 may be in the form of a standardized physical interface. For example, when memory system 862 is used for information (e.g., data) storage in computing system 856, memory interface 864 may be a serial advanced technology attachment (SATA) interface, a peripheral component interconnect express (PCIe) interface, or a universal serial bus (USB) interface, among other physical connectors and/or interfaces. In general, however, memory interface 864 may provide an interface for passing control, address, information, scaled preferences, and/or other signals between the controller 866 of memory system 862 and a host 858 (e.g., via host interface 860).

Controller 866 may include, for example, firmware and/or control circuitry (e.g., hardware). Controller 866 may be operably coupled to and/or included on the same physical device (e.g., a die) as one or more of the memory devices 868-1, . . . , 868-N. For example, controller 866 may be, or may include, an ASIC as hardware operably coupled to circuitry (e.g., a printed circuit board) including memory interface 864 and memory devices 868-1, . . . , 868-N. Alternatively, controller 866 may be included on a separate physical device that is communicatively coupled to the physical device (e.g., the die) that includes one or more of the memory devices 868-1, . . . , 868-N.

Controller 866 may communicate with memory devices 868-1, . . . , 868-N to direct operations to sense (e.g., read), program (e.g., write), and/or erase information, among other functions and/or operations for management of memory cells. Controller 866 may have circuitry that may include a number of integrated circuits and/or discrete components. In a number of embodiments, the circuitry in controller 866 may include control circuitry for controlling access across memory devices 868-1, . . . , 868-N and/or circuitry for providing a translation layer between host 858 and memory system 862.

Memory devices 868-1, . . . , 868-N may include, for example, a number of memory arrays 870 (e.g., arrays of volatile and/or non-volatile memory cells). For instance, memory devices 868-1, . . . , 868-N may include arrays of memory cells, such as a portion of an example memory device structured to include sense line contacts. At least one array includes a transistor having a gate structure formed according to the embodiments disclosed herein. As will be appreciated, the memory cells in the memory arrays 870 of memory devices 868-1, . . . , 868-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 868 may be formed on the same die. A memory device (e.g., memory device 868-1) may include one or more arrays 870 of memory cells formed on the die. A memory device may include sense circuitry 872 and control circuitry 874 associated with one or more arrays 870 formed on the die, or portions thereof. The sense circuitry 872 may be utilized to determine (sense) a particular data value (e.g., 0 or 1) that is stored at a particular memory cell in a row of an array 870. The control circuitry 874 may be utilized to direct the sense circuitry 872 to sense particular data values, in addition to directing storage, erasure, etc., of data values in response to a command from host 858 and/or host interface 860. The command may be sent directly to the control circuitry 874 via the memory interface 864 or to the control circuitry 874 via the controller 866.

The embodiment illustrated in FIG. 8 may include additional circuitry that is not illustrated so as not to obscure embodiments of the present disclosure. For example, memory device 868 may include address circuitry to latch address signals provided over I/O connectors through I/O circuitry. Address signals may be received and decoded by a row decoder and a column decoder to access a memory array 870. It will be appreciated that the number of address input connectors may depend on the density and/or architecture of memory devices 868 and/or memory arrays 870.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings, among other materials and/or components related to patterning a material over an active area for a sense line contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a material over an active area for a sense line contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first source/drain region and a second source/drain region formed in a substrate;
a gate opposing a channel that separates the first source/drain region and the second source/drain region; and
an isolation trench adjacent to an active area, wherein:
the isolation trench includes a dielectric material;
a depth of the isolation trench is greater than a depth of a trench in which the gate is formed, wherein the gate is included in a buried recessed access device (BRAD) formed in the trench; and
the isolation trench includes a passing access line formed on the dielectric material.

2. The apparatus of claim 1, wherein the active area comprises the first source/drain region, the second source/drain region, and the gate.

3. The apparatus of claim 1, wherein the apparatus further includes a sense line coupled to the first source/drain region and a storage node coupled to the second source/drain region.

4. The apparatus of claim 1, wherein the dielectric material has a conductive bias opposing a conductive bias of the channel.

5. The apparatus of claim 4, wherein the conductive bias of the channel is a p-type channel having a positive conductive charge; and the conductive bias of the dielectric material in the isolation trench is a negative fixed charge.

6. The apparatus of claim 1, wherein the BRAD is part of a dynamic random access memory (DRAM) array.

7. The apparatus of claim 1, wherein the dielectric material in the isolation trench includes a portion above a bottom portion of the gate of the BRAD.

8. The apparatus of claim 1, wherein the channel is undoped and, for a same value applied threshold voltage (Vt), has a lower storage node junction electric field (cell junction E-field) than a same dimension apparatus having a Boron doped channel.

9. The apparatus of claim 1, wherein the isolation trench has an aspect ratio in a range of 15:1 to 20:1.

10. An apparatus, comprising:
an isolation trench formed in a semiconductor material, wherein the isolation trench includes:
a first dielectric material;
a second dielectric material formed on the first dielectric material, wherein:
a height of the second dielectric material in the isolation trench rises above a bottom portion of a channel of an adjacent access device; and
the isolation trench is formed to a depth in the semiconductor material that is greater than a depth to which the adjacent access device was formed in the semiconductor material;
a passing access line material formed on the second dielectric material;
a third dielectric material formed on the passing access line material, wherein the third dielectric material is a sacrificial material; and
a fourth dielectric material.

11. The apparatus of claim 10, wherein:
the second dielectric material has a negative bias relative to a channel bias to an active area of the adjacent access device;
the second dielectric material is a different material than the first dielectric material; and
the second dielectric material is deposited in a bottom portion of the isolation trench.

12. The apparatus of claim 10, wherein the isolation trench is formed in the semiconductor material to a depth of 240 nanometers (nm).

13. The apparatus of claim 10, wherein the second dielectric material is deposited to a height of 20 angstroms (Å).

14. The apparatus of claim 10, wherein the third dielectric material is etched using a dry etch that has a selectivity of 30:1 to the second dielectric material.

15. The apparatus of claim 10, wherein the third dielectric material is etched using a wet etch that is selective to the second dielectric material.

16. An apparatus, comprising:
   an access device having a first source/drain region and a second source/drain region in a substrate, wherein the first source/drain region and the second source/drain region are separated by a channel; and
   an isolation trench neighboring the channel and the access device, wherein the isolation trench is formed by:
      etching an opening in the substrate;
      conformally depositing a first dielectric material into the opening;
      depositing a second dielectric material on the first dielectric material in the opening, wherein:
         a height of the second dielectric material in the isolation trench rises above a bottom portion of the channel; and
         the isolation trench is formed to a depth in the substrate that is greater than a depth to which the access device was formed in a semiconductor material;
      depositing a passing access line material on the second dielectric material;
      depositing a third dielectric material on the passing access line material in the opening;
      removing portions of the third dielectric material using a selective dry etch process; and
      recessing the second dielectric material in the opening using a wet etch process.

17. The apparatus of claim 16, wherein:
   the second dielectric material has a conductive bias opposite a conductive bias of the channel;
   the second dielectric material is a different material than the first dielectric material; and
   the second dielectric material is deposited in a bottom portion of the isolation trench.

18. The apparatus of claim 16, wherein critical dimensions of the access device are adjusted by adjusting a formation of the second dielectric material.

19. The apparatus of claim 16, wherein the first dielectric material is formed to a thickness of 3 nm.

20. The apparatus of claim 16, wherein the second dielectric material is formed to a thickness in a range of 1-5 nm.

\* \* \* \* \*